United States Patent [19]

Lee

[11] Patent Number: 5,821,884
[45] Date of Patent: Oct. 13, 1998

[54] SAMPLING RATE CONVERSION METHOD AND APPARATUS UTILIZING AN AREA EFFECT CORRELATION METHOD

[75] Inventor: Hyo-seoung Lee, Seoul, Rep. of Korea

[73] Assignee: Samsung Electronics Co., Ltd., Kyungki-do, Rep. of Korea

[21] Appl. No.: 790,614

[22] Filed: Jan. 29, 1997

[30] Foreign Application Priority Data

Jan. 29, 1996 [KR] Rep. of Korea ............... 96-1958

[51] Int. Cl.⁶ ........................................... H03M 7/00
[52] U.S. Cl. .................................. 341/61; 340/50
[58] Field of Search ............................. 341/61, 50

[56] References Cited

U.S. PATENT DOCUMENTS

| | | | |
|---|---|---|---|
| 4,460,890 | 7/1984 | Busby | 341/61 |
| 5,227,787 | 7/1993 | Kurashina | 341/61 |
| 5,481,267 | 1/1996 | Miyable et al. | 341/61 |
| 5,512,894 | 4/1996 | Ikeyama et al. | 341/61 |
| 5,621,404 | 4/1997 | Heiss et al. | 341/61 |
| 5,659,356 | 8/1997 | Asaida et al. | 348/222 |

*Primary Examiner*—Jeffrey A. Gaffin
*Assistant Examiner*—Kim N. Huynh
*Attorney, Agent, or Firm*—Sughrue, Mion, Zinn, Macpeak & Seas, PLLC

[57] ABSTRACT

A sampling rate conversion apparatus in which according to an area effect correlation method, an input signal having a first sampling rate K is converted into an output signal having a second sampling rate N. The apparatus includes a first data input device for inputting the first sampling rate and a horizontal synchronous signal or an effective pixel start signal and outputting a multiplication accumulation input data sequence generated by an area effect correlation method, a second data input device for outputting an area effect correlation coefficient generated by the area effect correlation method and the second sampling rate, and a multiplier for multiplying the area effect correlation coefficient and the multiplication accumulation input data device so that the input signal having the first sampling rate K is converted into the output signal having the second sampling rate N.

11 Claims, 5 Drawing Sheets

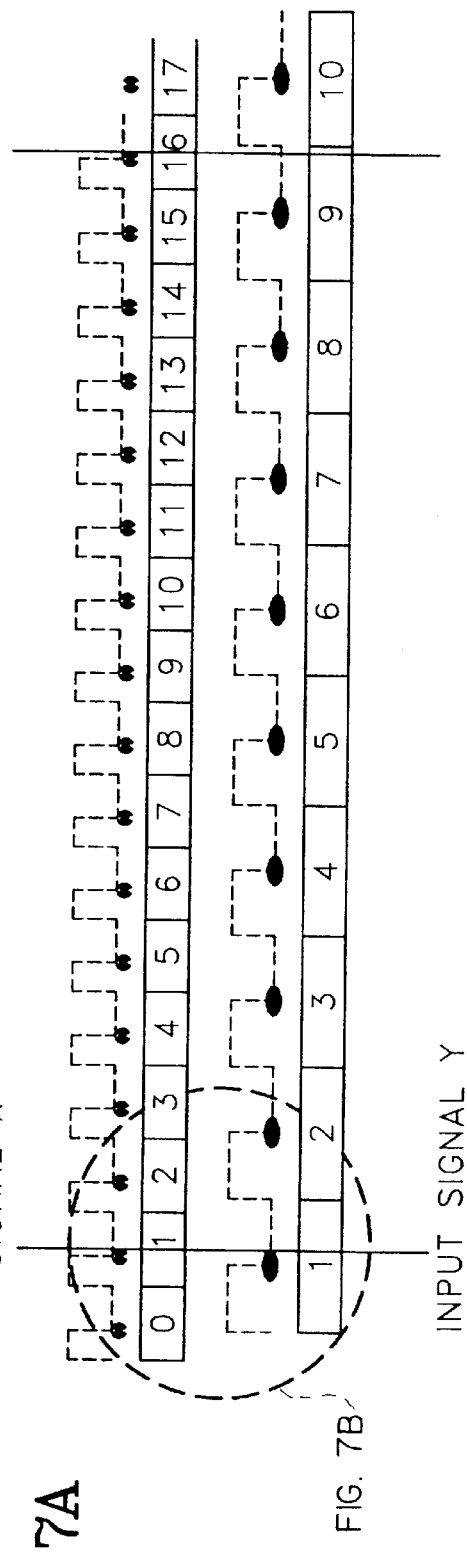
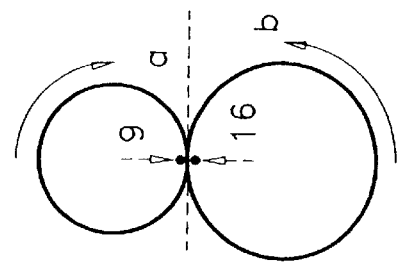
FIG. 7A
FIG. 7B
FIG. 7C
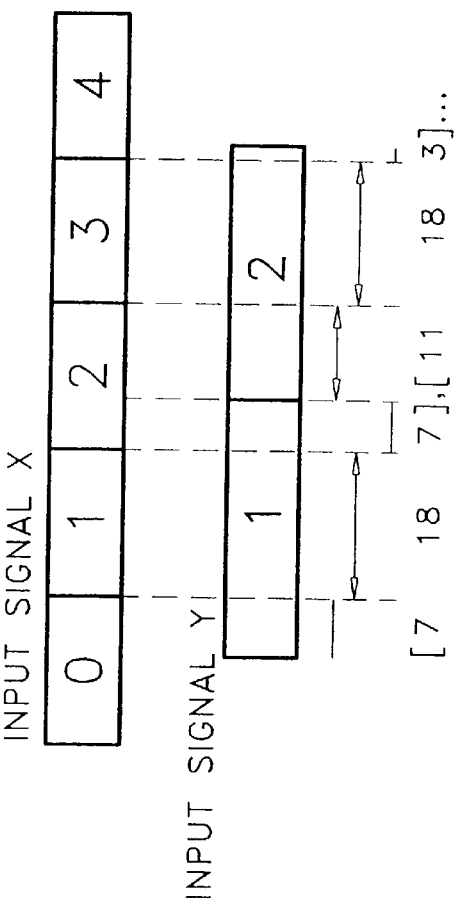

SAMPLING RATE CONVERSION METHOD AND APPARATUS UTILIZING AN AREA EFFECT CORRELATION METHOD

BACKGROUND OF THE INVENTION

The present invention relates to a sampling rate conversion method and apparatus, and, more particularly, a sampling rate conversion apparatus in which, according to an area effect correlation method, a first sampling rate K of an input digital video signal is converted into a second sampling rate N of an output signal.

A conventional sampling rate conversion method for a digital video signal employs a combination of decimation and interpolation. FIG. 1A illustrates a block diagram of a conventional sampling rate conversion apparatus for a digital video signal. In order to implement 16:9 downsampling of a video signal (e.g., having a frequency of 74.25 MHz), a first sampling rate converter 11 receives an input signal with a frequency of 74.25 MHz as shown in FIG. 2A, oversamples the signal by a factor of 9, and outputs a signal shown in FIG. 2B. A low-pass filter (LPF) 12 receives the oversampled signal output by the first sampling rate converter 11, filters the signal (i.e., low-pass filtering) to avoid aliasing, and outputs a signal as shown in FIG. 2C. The second sampling rate converter 13 downsamples the low-pass filtered signal by a factor of 16, and outputs a signal as shown in FIG. 2D.

FIG. 1B illustrates the frequency characteristics of the low-pass filter 12. The cut-off frequency, $F_{STOP}$, has the following relationships with a sampling frequency of the input signal, $F_S$:

$$F_{STOP}=(F_S/2)(9/16).$$

Thus, in a conventional sampling rate conversion method, to convert the sampling rate of a non-integer multiple such as 16:9, 9× oversampling is first performed. Therefore, the sampling rate of a 74.25 MHz signal which is the input data sampling rate of signal according to the MPEG-2 (Moving Picture Experts Group-2) standard is increased up to 668.25 MHz by oversampling by a factor of 9. Thus, because it is difficult to implement hardware at such a high sampling rate, the conventional method and apparatus as described above are not acceptable.

SUMMARY OF THE INVENTION

To solve the above problem, it is an object of the present invention to provide an area effect correlation method for converting an input signal having a first sampling rate to an output signal having a second sampling rate by using the area ratio of rectangles corresponding to input and output signals.

It is another object of the present invention to provide a method and apparatus for converting a sampling rate of a signal by adopting the area effect correlation method.

Accordingly, to achieve the above and other objects, there is provided a method for converting an input signal having a first sampling rate K into an output signal having a second sampling rate N. The method includes the steps of: matching K units of a first set of rectangles with N units of second set of rectangles, wherein each rectangle of the first set of rectangles has the same area, each rectangle of the second set of rectangles has the same area, and the total area of the first set of rectangles equals the total area of the second set of rectangles, and generating a multiplication accumulation input data sequence which represents an order of the first set of rectangles corresponding to one of the second set of rectangles and an area effect correlation coefficient which represent the area ratio of portions of the second set of rectangles corresponding to selected rectangles of the first set of rectangles.

Further, in accordance with the foregoing objects of the present invention, there is provided a sampling rate conversion method for converting an input signal having a first sampling rate K into an output signal having a second sampling rate N. The sampling rate conversion method includes the steps of: matching K units of a first set of rectangles with N units of a second set of rectangles, wherein each rectangle of the first set of rectangles has the same area, each rectangle of the second set of rectangles has the same area, and the total area of the first set of rectangles equals the total area of the second set of rectangles, generating a multiplication accumulation input data sequence which represents an order of the first set of rectangles corresponding to one of the second set of rectangles, and an area effect correlation coefficient which represents the area ratio of portions of the second set of rectangles corresponding to one of the first set of rectangles, and converting the input signal having the first sampling rate K into the output signal having the second sampling rate N by using the area effect correlation coefficient and the multiplication accumulation input data sequence.

Even further, there is provided in accordance with the objects of the present invention, a sampling rate conversion apparatus for converting an input signal having a first sampling rate K into an output signal having a second sampling rate N. The apparatus includes a first data input device for inputting the first sampling rate and a control signal and outputting a multiplication accumulation input data sequence generated in accordance with an area effect correlation method, a second data input device for outputting an area effect correlation coefficient generated in accordance with the area effect correlation method and the second sampling rate, and a multiplier for multiplying the area effect correlation coefficient and the multiplication accumulation input data device so that the input signal having the first sampling rate K is converted into the output signal having the second sampling rate N.

BRIEF DESCRIPTION OF THE DRAWINGS

The above objects and advantages of the present invention will become more apparent by describing in detail a preferred embodiment thereof with reference to the attached drawings in which:

FIG. 7 shows timing diagrams of an area effect correlation method according to the present invention.

DETAILED DESCRIPTION OF PREFERRED EMBODIMENTS OF THE INVENTION

Figure 1A:
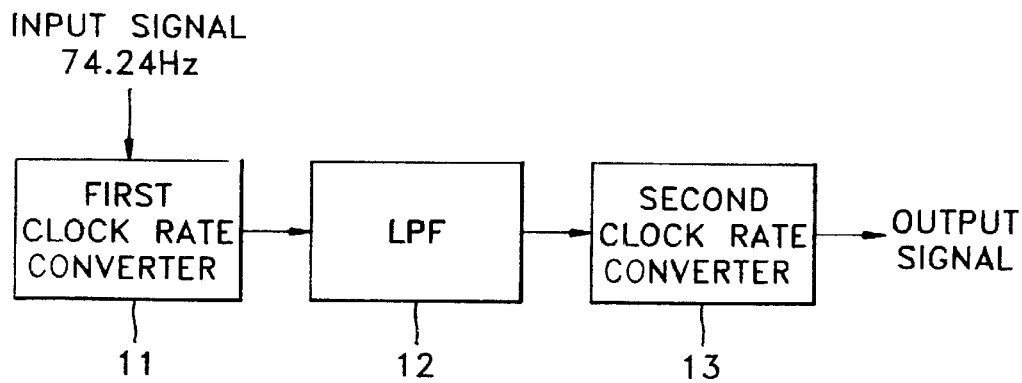
FIG. 1A illustrates a block diagram of a conventional sampling rate conversion apparatus for a digital video signal.
Figure 1B:
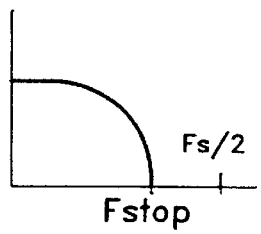
FIG. 1B illustrates frequency characteristics of the low-pass filter shown in FIG. 1A.
Figure 2A:
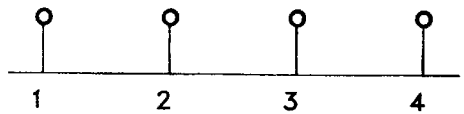
FIGS. 2A–2D illustrate waveforms of signals input to or output from each of the components of FIG. 1A.
Figure 2B:
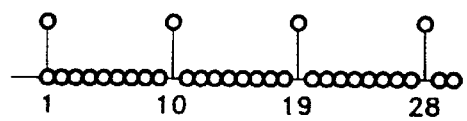
Figure 2C:
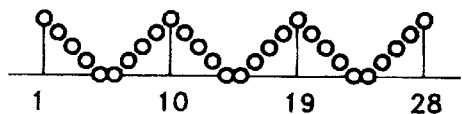
Figure 2D:
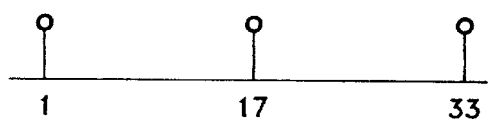
Figure 3:
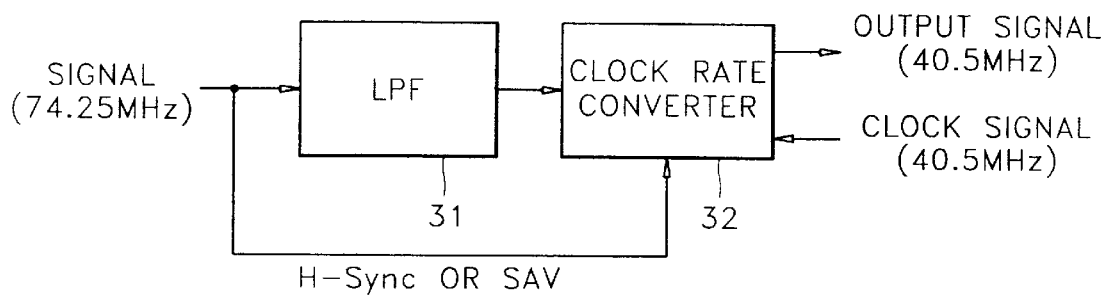
FIG. 3 shows a block diagram of a sampling rate conversion apparatus for a digital video signal according to the present invention.
Figure 4:
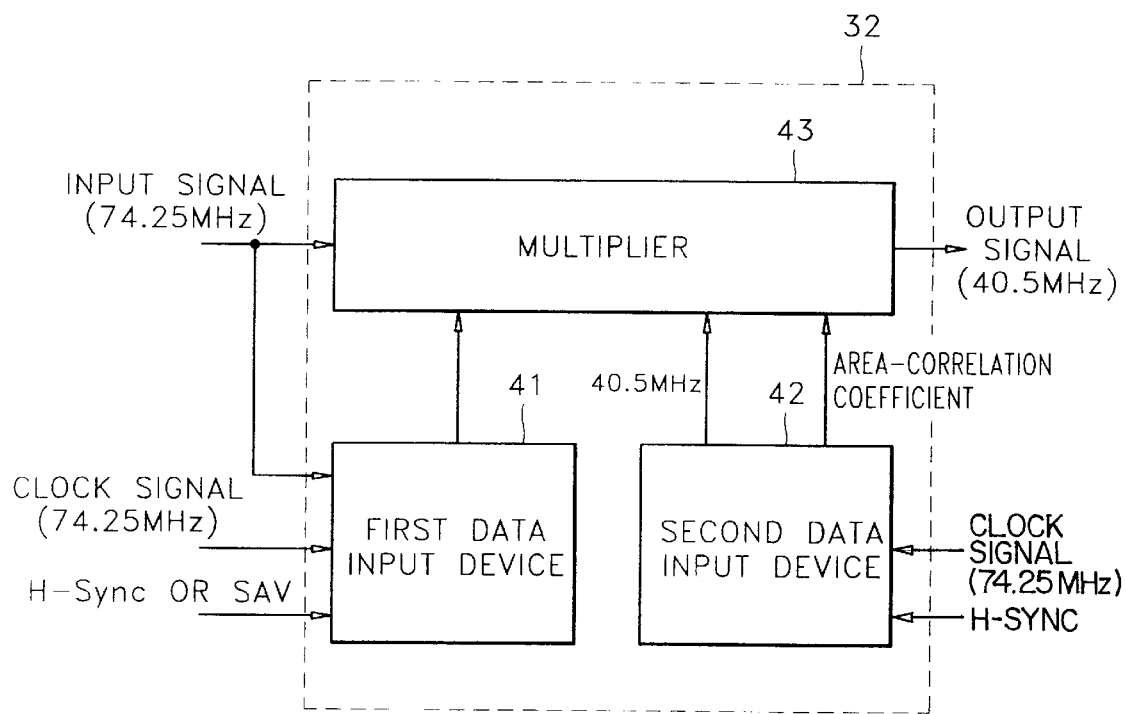
FIG. 4 shows a detailed block diagram of the sampling rate converter shown in FIG. 3.

Referring to FIG. 3, there is shown a sampling rate conversion apparatus for a digital video signal according to the present invention. The conversion apparatus includes a lowpass filter (LPF) 31 and a sampling rate converter 32. FIG. 4 shows a detailed block diagram of the sampling rate converter 32 shown in FIG. 3.

The sampling rate converter 32 includes a first data input device 41, a second data input device 42 and a multiplier 43. The first data input device 41 receives an input signal carrying source data, a clock signal of 74.25 MHz, and a horizontal synchronous signal (H-Sync) or an effective pixel start signal (SAV, start active value), and outputs a multiplication accumulation input data string generated through an area effect correlation method to the multiplier 43.

The second data input device 42 also receives a first clock signal of 74.25 MHz, and a horizontal synchronous signal (H-Sync) or an effective pixel start signal (SAV), and outputs an area correlation coefficient generated by the area effect correlation method and a second clock signal of 40.5 MHz to the multiplier 43.

The multiplier 43 converts the input signal having the first sampling rate (74.25 MHz) to an output signal having the second sampling rate (40.5 MHz) by multiplying the area correlation coefficient to each sample of a predetermined multiplication accumulation input data sequence.

The operation of the present invention having a structure as described above will be described. However, first a description of the area effect correlation method according to the present invention, with reference to FIG. 7, will be set forth.

In order to obtain 9 samples of data corresponding to 16 samples of data, 16 small rectangles are compared with 9 large rectangles as shown in FIG. 7. At this time, the total area of the 16 small rectangles is the same as that of the 9 large rectangles. If a point is positioned at the center of each square, the 16 center points of the small rectangles will correspond to the 9 center points of the large rectangles.

As an alternative, assume that a cylinder "a" having a radius of 9 is in contact with a cylinder "b" having a radius of 16, and the cylinder "a" rotates 16 times while the cylinder "b" rotates 9 times. If ink is dropped on a contact point of the two cylinders and paper is inserted between the circles, 16 points will be made on the top face of the paper while 9 points are made on the bottom face of the paper.

To determine the relationships between the large rectangles and the small rectangles based on their areas, it is assumed that the first large rectangle corresponds to (7/32) of the zero-th small rectangle, (18/32) of the first small rectangle, and (7/32) of the second small rectangle. Then, the second large rectangle corresponds to (11/32) of the second small rectangle, (18/32) of the third small rectangle, and (3/32) of the fourth small rectangle. Consecutively, a relationship between all of the large and small rectangles can be defined. From the above relationships, the area correlation coefficient is obtained by multiplying the ratios of portions of three small rectangles corresponding to each large rectangles by 32. Also, the multiplication accumulation input data sequence indicates the sequence of the small rectangles corresponding to each large rectangles as above.

Though the area correlation coefficients can be calculated manually, it is more convenient to calculate and generate the coefficients through hardware or by computer software. When the area correlation coefficients are obtained by software, the coefficients can be adjusted to any conversion rate easily just by adjusting the variables in the program.

In the case of 16:9 downsampling, an example of the area correlation coefficients and the multiplication accumulation input data sequences are shown in Table 1.

TABLE 1

| Area Correlation Coefficient | Multiplication Accumulation Input Data Sequence |
|---|---|
| [7 18 7] | [0 1 2] |
| [11 18 3] | [2 3 3] |
| [15 0 17] | [4 4 5] |
| [1 18 13] | [5 6 7] |
| [5 18 9] | [7 8 9] |
| [9 18 5] | [9 10 11] |
| [13 18 1] | [11 12 13] |
| [17 0 15] | [13 13 14] |
| [3 18 11] | [14 15 16] |

The operation of the sampling rate conversion apparatus using the above-mentioned area effect correlation method will now be described, with reference to FIGS. 3–6.

In FIG. 3, the low-pass filter (LPF) 31 and the sampling rate converter 32 receive a horizontal synchronous signal H-Sync or an effective pixel start signal SAV and a digital signal of which the sampling rate is to be converted (hereinafter called "the source data").

The LPF 31 removes frequency components of the source data signal which exceed a predetermined cutoff frequency. For example, in the case of 16:9 down-conversion, the cutoff frequency $F_{STOP}$ of the LPF 31 is $F_{SS}/2*9/16$. Here, $F_{SS}$ is the sampling rate of the source data. The output signal from the LPF 31 is input to the sampling rate converter 32.

The first and second data input devices 41 and 42 output the multiplication accumulation input data sequence and the area correlation coefficient obtained by the area effect correlation method to the multiplier 43 at a rate of 9 symbol data per 16 source data.

The multiplier 43 inputs the multiplication accumulation input data sequence and the area correlation coefficient output from the first and second data input devices 41 and 42, respectively, and calculates the downsampled data through the following expressions (1).

$Y(1)=(7/32) \times X(0)+(18/32) \times X(1)+(7/32) \times X(2)$ $Y(2)=(11/32) \times X(2)+(18/32) \times X(3)+(3/32) \times X(4)$ $Y(3)=(15/32) \times X(4)+(0/32) \times X(4)+(17/32) \times X(5)$ $Y(4)=(1/32) \times X(5)+(18/32) \times X(6)+(13/32) \times X(7)$ $Y(5)=(5/32) \times X(7)+(18/32) \times X(8)+(9/32) \times X(9)$ $Y(6)=(9/32) \times X(9)+(18/32) \times X(10)+(5/32) \times X(11)$ $Y(7)=(13/32) \times X(11)+(18/32) \times X(12)+(1/32) \times X(13)$ $Y(8)=(17/32) \times X(13)+(0/32) \times X(13)+(15/32) \times X(14)$ $Y(9)=(3/32) \times X(14)+(18/32) \times X(15)+(11/32) \times X(16)$ The first and second data input devices 41 and 42 and the multiplier 43 will now be described in detail.

Figure 5:
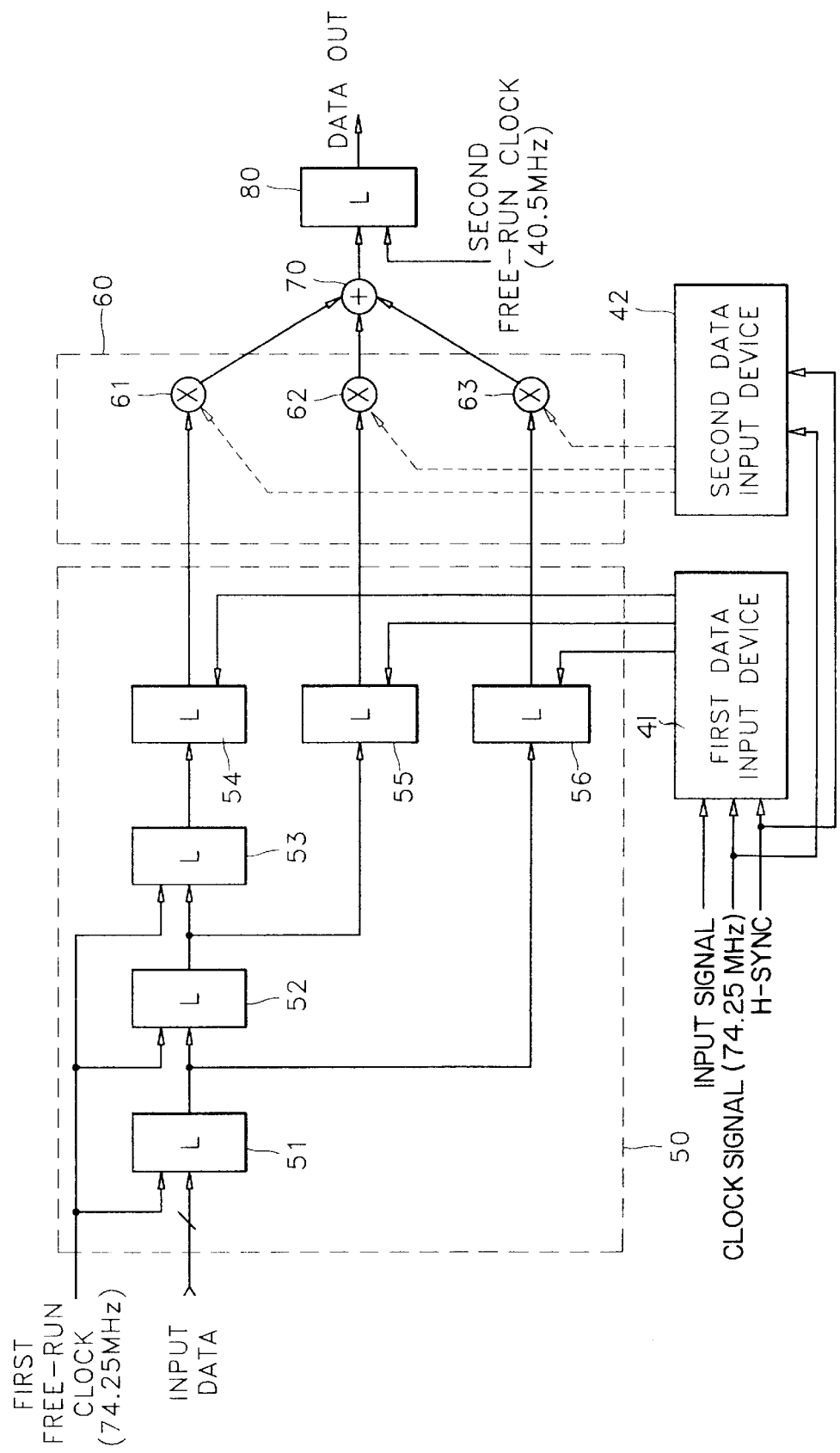
FIG. 5 illustrates a detailed block diagram of the multiplier shown in FIG. 4.
Figure 6:
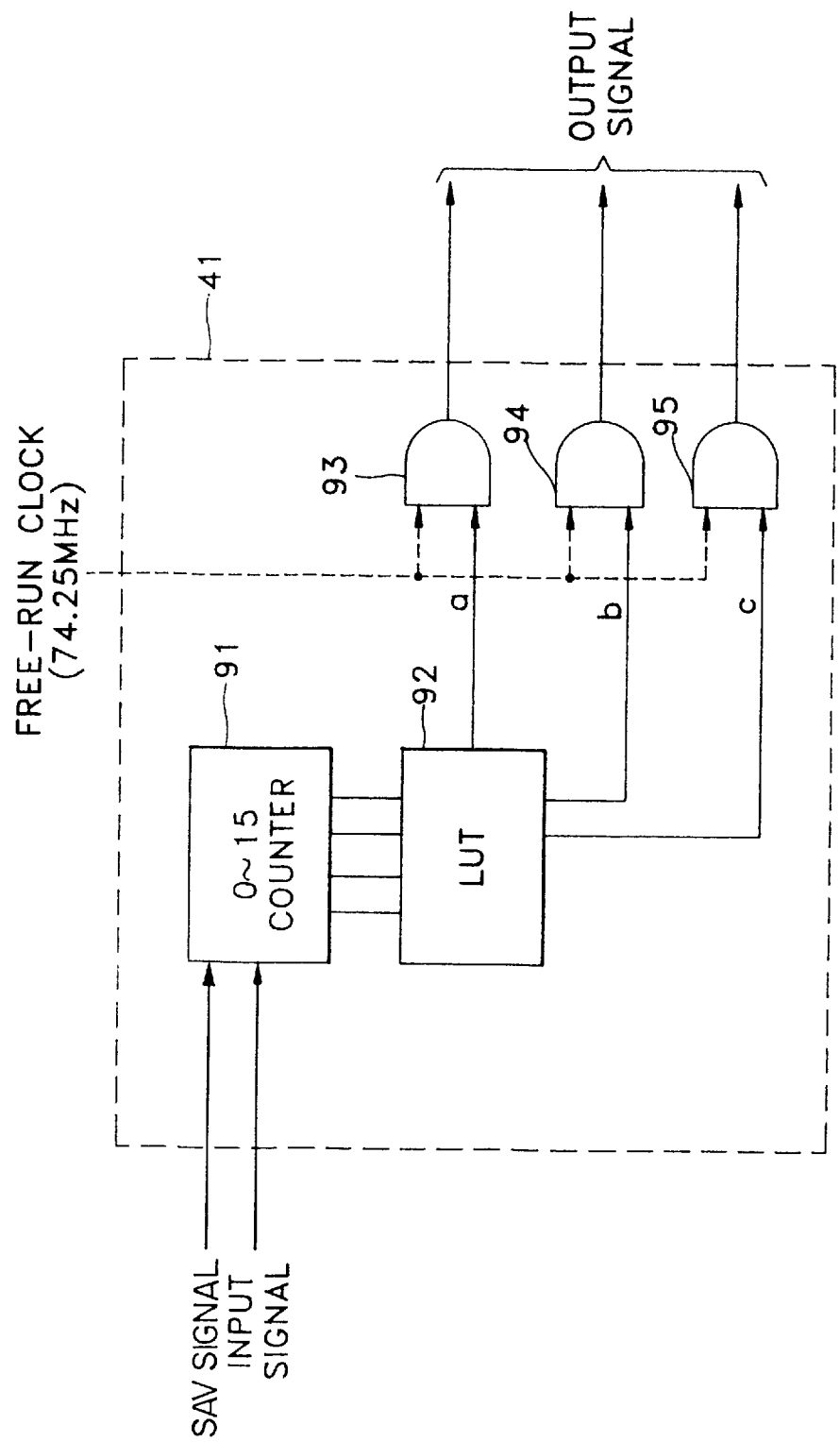
FIG. 6 is a detailed block diagram of the first data input device shown in FIG. 4.

Referring to FIGS. 5 and 6, the counter 91 of the first data input device 41 is reset by the SAV signal, which indicates a starting point of the multiplication accumulation input data sequence and area effect correlation coefficient, to initiate the data conversion operation at a starting point of an effective pixel. Then, the counter 91 inputs the source data having a frequency of 74.25 MHz, and counts sequentially 16 sample data to output the counted value to a lookup table 92.

The lookup table (LUT) 92 inputs the counted value from the counter 91 and outputs signals "a," "b" and "c" according to the counted value. Specifically, the LUT 92 outputs "1" in the case where the counted value is one of (0, 2, 4, 5, 7, 9, 11 or 14)+2, while it outputs a "0" otherwise as the signal "a". Also, the LUT 92 outputs a "1" in case that the counted value is one of (1, 3, 4, 6, 8, 10, 12, 13 or 15)+1, while it outputs "0" otherwise as the signal "b". Similarly, the LUT 92 outputs "1" when the counted value is one of (2, 4, 5, 7, 9, 11, 14 or 15)+0, while it outputs a "0" otherwise as the signal "c". The AND gates 93–95 carry out an AND operation with respect to each of the signals "a", "b" and "c", respectively, and a first clock of 74.25 MHz. The signals output by the AND gates 93–95 are used as selection clock signals for selecting a multiplication accumulation input data sequence by the multiplier 43. That is, when the multiplier 43 has to hold data, the first data input device 41 deactivates the corresponding selection clock signal so that data skew is not generated.

The second data input device 42 outputs the area effect correlation coefficients which are stored in a lookup table (not shown) or a ROM (not shown) to the multiplier 43, according to the signals output by the AND gates 93–95.

The multiplier 43 includes a bank of latches 50 and multiplying circuit 60. The latches 51–53 of the multiplier 43 latches the source data of which sampling rate is to be converted by a first free-running clock of 74.25 MHz. The latch 54, 55 and 56 latches signals output by each of the latches 53, 52 and 51 by the selection clock signals and output the latched signals to each of the multipliers 61, 62 and 63. The multipliers 61–63 multiply the area effect correlation coefficients output by the second data input device 42 to the signals output by the latches 54, 55 and 56 to output partial multiplications corresponding to the expressions (1). An adder 70 adds the outputs of the multipliers 61–63 to output a sum corresponding to the expressions (1). The latch 80 latches the output of the adder 70 by the second free-running clock of 40.5 MHz to output the latched data.

As an alternative embodiment, a phase-locked loop (PLL) circuit (not shown) or a dual port memory (not shown) may be inserted between the adder 70 and the latch 80 in order to avoid data skew.

In the above description, the present invention was explained only for the case of down-sampling. However, it can also be applied to up-sampling by changing the variables in the area effect correlation method.

Furthermore, as described above, the present invention can convert the sampling rate easily by a non-integer factor such as 16:9. Also, since the sampling rate is not increased during the data conversion, there are no additional costs incurred or technical problems encountered for speed increases in hardware implementation.

There has thus been shown and described a novel sampling rate conversion method and apparatus which fulfills all the objects and advantages sought therefor. Many changes, modifications, variations and other uses and applications of the subject invention will, however, become apparent to those skilled in the art after considering the specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. A method for converting an input signal having a first sampling rate K into an output signal having a second sampling rate N, said method comprising the steps of:

matching K units of a first set of rectangles with N units of second set of rectangles, wherein each rectangle of said first set of rectangles has the same area, each rectangle of said second set of rectangles has the same area, and the total area of said first set of rectangles equals the total area of said second set of rectangles; and generating a multiplication accumulation input data sequence which represents an order of said first set of rectangles corresponding to one of said second set of rectangles and an area effect correlation coefficient which represent the area ratio of portions of said second set of rectangles corresponding to selected rectangles of said first set of rectangles.

2. A sampling rate conversion method for converting an input signal having a first sampling rate K into an output signal having a second sampling rate N, said sampling rate conversion method comprising the steps of:

matching K units of a first set of rectangles with N units of a second set of rectangles, wherein each rectangle of said first set of rectangles has the same area, each rectangle of said second set of rectangles has the same area, and the total area of said first set of rectangles equals the total area of said second set of rectangles;

generating a multiplication accumulation input data sequence which represents an order of said first set of rectangles corresponding to one of said second set of rectangles, and an area effect correlation coefficient which represents the area ratio of portions of said second set of rectangles corresponding to one of said first set of rectangles; and converting the input signal having the first sampling rate K into the output signal having the second sampling rate N by using the area effect correlation coefficient and the multiplication accumulation input data sequence.

3. A sampling rate conversion apparatus for converting an input signal having a first sampling rate K into an output signal having a second sampling rate N, said apparatus comprising:

a first data input device for receiving the first sampling rate and a control signal and outputting a multiplication accumulation input data sequence generated in accordance with an area effect correlation method;

a second data input device for receiving the first sampling rate and the control signal and outputting an area effect correlation coefficient, generated in accordance with said area effect correlation method, and the second sampling rate; and a multiplier for multiplying the area effect correlation coefficient and the multiplication accumulation input data sequence so that the input signal having the first sampling rate K is converted into the output signal having the second sampling rate N.

4. The sampling rate conversion apparatus as defined by claim 3, further comprising a lowpass filter for removing a frequency component exceeding a predetermined cutoff frequency from the input signal.

5. The sampling rate conversion apparatus as defined by claim 3, wherein said first data input device comprises a counter, responsive to said control signal, for counting periods of said input signal; a lookup table, coupled to an output of said counter, for producing sequence control data; and means, responsive to a first clock signal, for selectively producing said multiplication accumulation input data sequence.

6. The sampling rate conversion apparatus as defined by claim 5, wherein said means comprises a set of AND gates, each having first and second inputs, each of said first inputs being coupled to an output of said lookup table, and each of said second inputs being coupled to said first clock signal.

7. The sampling rate conversion apparatus as defined by claim 5, wherein said multiplier comprises a plurality of latches, responsive to said first clock signal, said input signal, and said multiplication accumulation input data sequence generated by said first data input device; and a plurality of multipliers, coupled to an output of said plurality of latches and to said second data input device to receive said area effect correlation coefficient, each of said plurality of multipliers producing intermediate values; an adder, coupled to an output of said plurality of multipliers, for adding each of said intermediate values to produce a composite value; and means for latching said composite value in synchronism with a second clock signal and producing said output signal having the second sampling rate N.

8. The sampling rate conversion apparatus as defined by claim 7, wherein the values K and N equals 16 and 9, respectively, said first clock signal has a frequency of 74.25 MHz, and said second clock signal has a frequency of 40.5 MHz.

9. The sampling rate conversion apparatus as defined by claim 3, wherein said multiplier comprises a plurality of latches, responsive to a first clock signal, said input signal, and said multiplication accumulation input data sequence generated by said first data input device; and a plurality of multipliers, coupled to an output of said plurality of latches and to said second data input device to receive said area effect correlation coefficient, each of said plurality of multipliers producing intermediate values; an adder, coupled to an output of said plurality of multipliers, for adding each of said intermediate values to produce a composite value; and means for latching said composite value in synchronism with a second clock signal and producing said output signal having the second sampling rate N.

10. The sampling rate conversion apparatus as defined by claim 3, wherein the values K and N equals 16 and 9, respectively.

11. The sampling rate conversion apparatus as defined by claim 3, wherein said area correlation coefficient corresponds to the amount of overlap between one period X of the input signal at said sampling rate K and a corresponding period Y of the output signal at said sampling rate N, and said multiplication accumulation input data sequence provides a correlation between the periods X and Y of said input and output signals, respectively.

* * * * *